United States Patent
Thelen, Jr.

(10) Patent No.: US 9,667,265 B2
(45) Date of Patent: May 30, 2017

(54) METHOD OF FORMING AN AMPLIFIER AND STRUCTURE THEREFOR

(71) Applicant: SEMICONDUCTOR COMPONENTS INDUSTRIES, LLC, Phoenix, AZ (US)

(72) Inventor: Donald Claude Thelen, Jr., Bozeman, MT (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/232,279

(22) Filed: Aug. 9, 2016

(65) Prior Publication Data
US 2017/0047937 A1 Feb. 16, 2017

Related U.S. Application Data

(60) Provisional application No. 62/203,680, filed on Aug. 11, 2015.

(51) Int. Cl.
H03M 1/08 (2006.01)
H03M 1/12 (2006.01)
H03F 3/45 (2006.01)

(52) U.S. Cl.
CPC ........ H03M 1/124 (2013.01); H03F 3/45475 (2013.01); H03M 1/08 (2013.01); H03F 2203/45248 (2013.01); H03F 2203/45514 (2013.01); H03F 2203/45634 (2013.01)

(58) Field of Classification Search
CPC ........ H03F 3/211; H03F 3/3044; H03F 3/245; H03F 3/195; H03F 3/602; H03F 3/2171; H03F 3/3088; H03F 1/307; H03F 1/0288; H03G 1/0088
USPC ................ 330/295, 251, 255, 131, 133, 253
See application file for complete search history.

(56) References Cited

U.S. PATENT DOCUMENTS

| 8,427,804 B2* | 4/2013 | Matsumoto | ............. H03F 1/523 361/93.7 |
|---|---|---|---|
| 2002/0118048 A1 | 8/2002 | Kulhalli et al. | |
| 2002/0171387 A1 | 11/2002 | Stancu et al. | |
| 2004/0239421 A1* | 12/2004 | Wang | ................... H03G 1/0088 330/133 |
| 2009/0180530 A1* | 7/2009 | Ahn | ...................... H03F 1/0266 375/238 |
| 2010/0321108 A1* | 12/2010 | Lee | ...................... H03G 3/3042 330/131 |
| 2013/0272547 A1* | 10/2013 | Waller, Jr. | ................ H04R 3/00 381/120 |
| 2014/0035680 A1* | 2/2014 | Chen | ..................... H03F 1/0288 330/295 |
| 2014/0218116 A1* | 8/2014 | Cui | ...................... H03F 1/0288 330/295 |

* cited by examiner

Primary Examiner — Lam T Mai
(74) Attorney, Agent, or Firm — Robert F. Hightower

(57) ABSTRACT

In one embodiment, an amplifier is configured to include a pre-drive circuit that forms an estimated value of an output signal of the amplifier and forces the output to the estimated value before the amplifier forms the output signal.

19 Claims, 9 Drawing Sheets

| FIG. 9 REFERENCE | OUTPUT OF MONITOR 41 | FIG. 9 INTERVAL OF PRE-DRIVE SIGNAL | QUANTITY OF FIG. 6 CAPACITORS |
|---|---|---|---|
| A TO B | 000 | J | -12 |
| B TO C | 001 | K | -3 |
| C TO D | 010 | L | 5 |
| D TO E | 011 | K | -4 |
| E TO F | 100 | L | 4 |
| F TO G | 101 | K | -5 |
| G TO H | 110 | L | 3 |
| H TO I | 111 | M | 12 |

METHOD OF FORMING AN AMPLIFIER AND STRUCTURE THEREFOR

PRIORITY CLAIM TO PRIOR PROVISIONAL FILING

This application claims priority to prior filed Provisional Application No. 62/203,680 entitled "SLEW RATE ENHANCEMENT FOR ANALOG-TO-DIGITAL CONVERTERS" filed on Aug. 11, 2015, and having common inventors Donald Claude Thelen Jr. which is hereby incorporated herein by reference

CROSS-REFERENCE TO RELATED APPLICATIONS

This application is related to an application entitled "METHOD OF FORMING A SEMICONDUCTOR DEVICE AND STRUCTURE THEREFOR" Ser. No. 15/232,248, having a common assignee, and inventor Donald Claude Thelen, Jr. which is filed concurrently herewith and which is hereby incorporated herein by reference.

BACKGROUND OF THE INVENTION

The present invention relates, in general, to electronics, and more particularly, to semiconductors, structures thereof, and methods of forming semiconductor devices.

In the past, the electronics industry utilized various methods and structures to form analog-to-digital (A/D) converters. For the pipeline type of A/D converters, the conversion rate often could be affected by the slew rate of the amplifier used in the converter. Some applications would increase the power dissipation of the amplifier in order to increase the slew rate but this often caused high power dissipation and was undesirable for battery type of operations. Some other types utilized switch capacitor techniques to couple signals between internal nodes within an operational amplifier in order to produce more output current from the amplifier. However, these needed large capacitors and were sensitive to charge injection errors from the switches.

Accordingly, it is desirable to have an amplifier that has a higher slew rate, or that has minimized power dissipation.

Figure 1:
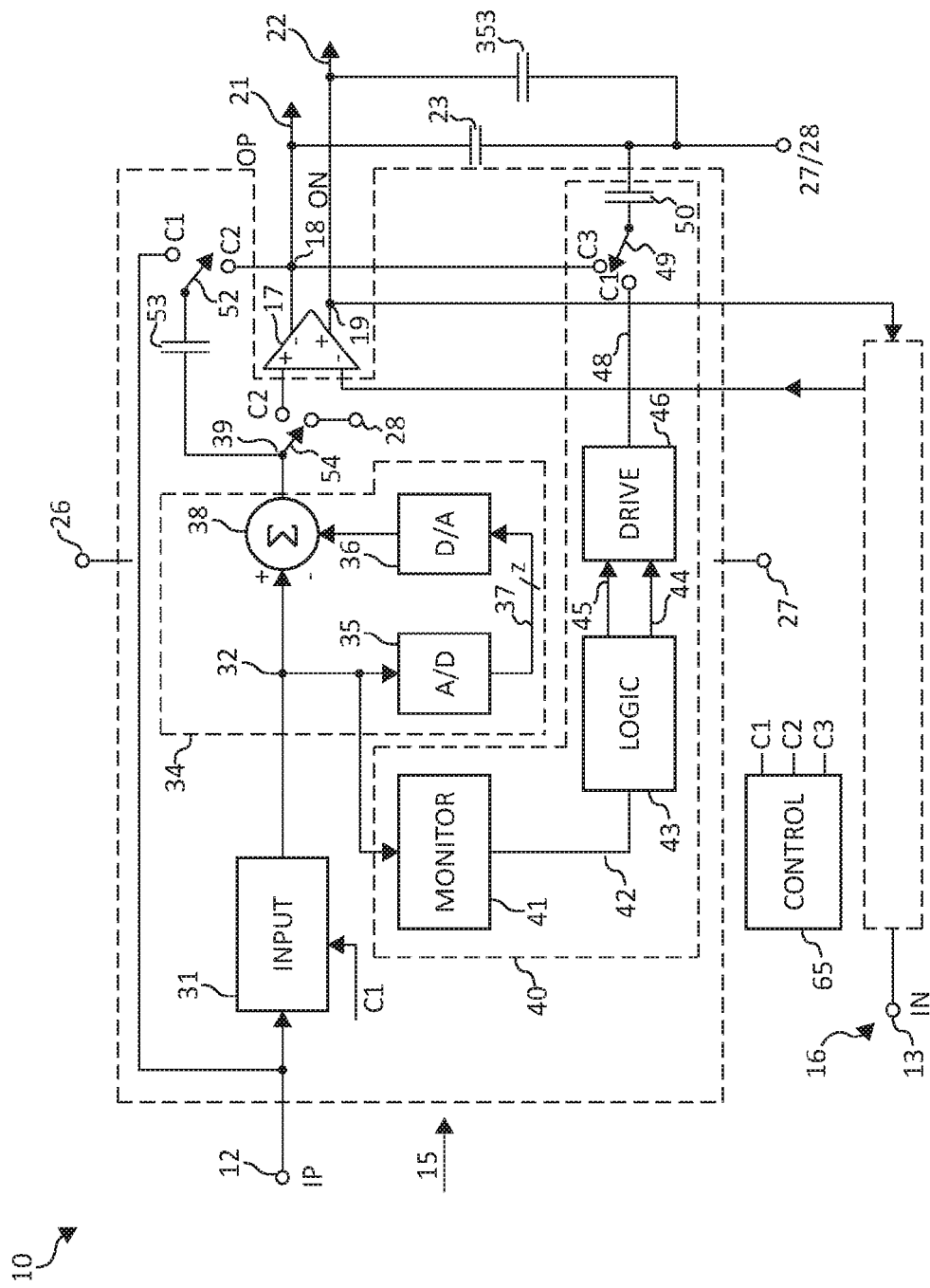
FIG. 1 schematically illustrates an example of a portion of an embodiment of an amplifier circuit in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates an example of a portion of an embodiment of amplifier stage of a pipelined Analog-to-digital conversion (ADC) circuit 10 that includes a circuit to increase the slew rate of circuit 10. In some embodiments, portions of circuit 10 may be a portion of an amplifier with switched capacitor negative feedback. Circuit 10 may receive operating power to operate the circuit elements between a voltage input 26 and a common voltage return 27. In some embodiments, return 27 may be a common ground return or may be a power supply voltage that is less than ground.

In some embodiments, circuit 10 may be a differential circuit that receives a differential input signal or may be a single ended circuit that receives a single ended input signal. For an embodiment where circuit 10 is a differential circuit, circuit 10 may include a positive processing channel 15 and a negative processing channel 16. Channel 15 receives a positive input signal IP on an input 12 and forms a positive output signal OP on an output 21, and channel 16 receives a negative input signal IN on an input 13 and forms a negative output signal ON on a negative output 22. In an embodiment, signals IP and IN may have substantially the same amplitude or magnitude but phases that may be substantially opposite to each other. Circuit 10 may have an embodiment wherein channels 15 and 16 may have substantially the same circuit configuration but one channel processes the positive portion (IP) of the input signal and the other channel processes the negative portion (IN) of the input signal. In an example embodiment of a single ended embodiment, channel 16 may be omitted.

Circuit 10 also includes an amplifier 17 that is configured to form the output signals OP and ON in response to the received input signal. An embodiment of amplifier 17 may include an operation amplifier or a transconductance amplifier. In a differential embodiment, amplifier 17 may include a positive input that may be connected to receive signals from positive channel 15 and form the positive output signal OP, and may include a negative input that may be connected to receive signals from negative channel 16 and form the negative output signal ON. A load may be connected to output 21 to receive the output signal. The load is illustrated in a general manner by a capacitor 23. In the differential embodiment, output 22 would also have a load that would be represented by a capacitor 353 similar to capacitor 23.

In some embodiments, channel 15 may include an optional input circuit 31 that may be configured to form a first signal 32 that is representative of the input signal. An example of an embodiment of circuit 31 may include a sample-and-hold circuit configured to sample the input signal IP during a first time interval and hold the sampled value as first signal 32 during a second time interval. In some embodiments, circuit 10 may be configured to form the output signal OP (and ON for the differential embodiment) during the second time interval. In some embodiments, circuit 31 may be omitted and signal 32 may be substantially the same as the input signal IP. Circuit 10 may include a control circuit 65 that is configured to form control signals for operating circuit 10.

Figure 2:
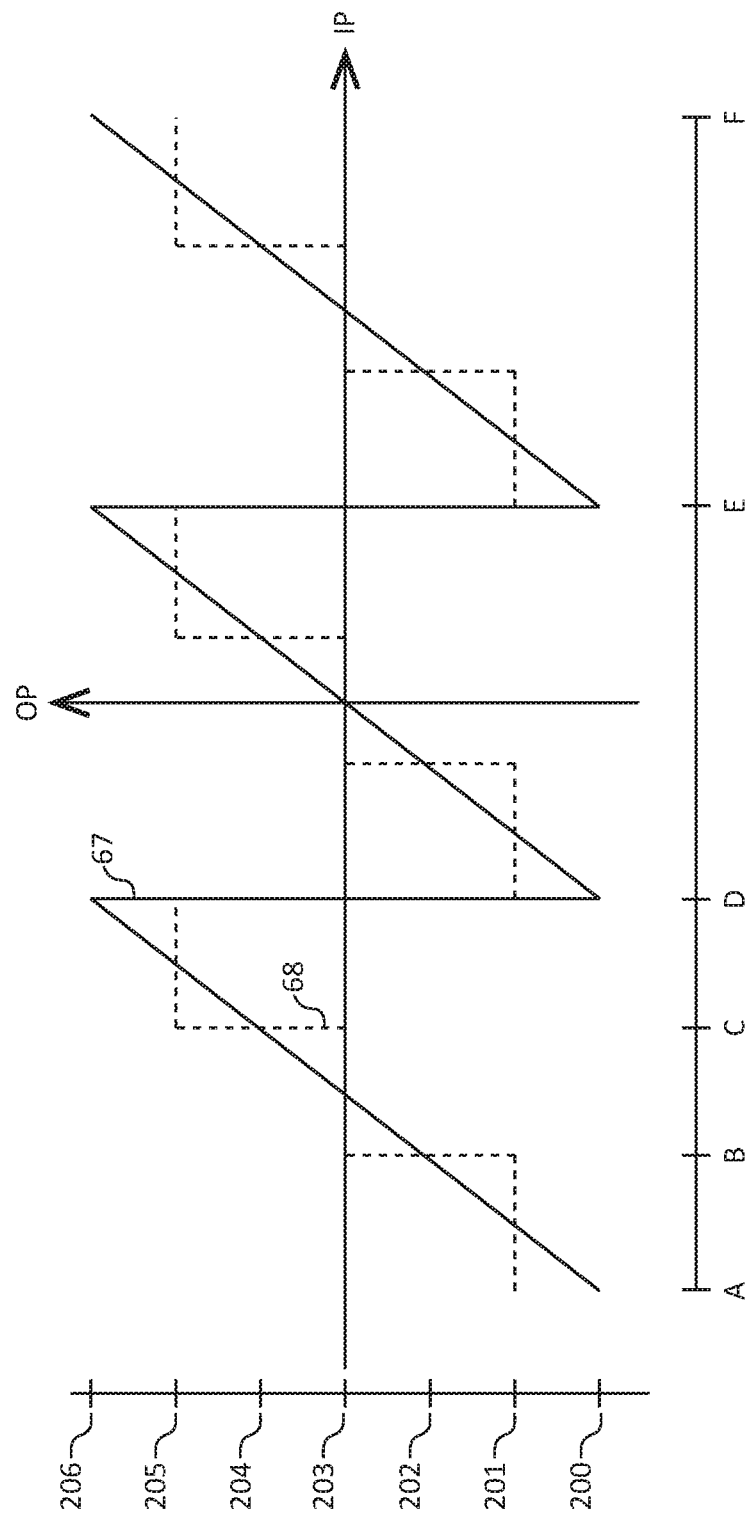
FIG. 2 is a graph illustrating an example of an embodiment of a relationship between some signals of the circuit of FIG. 1 in accordance with the present invention.

FIG. 2 is a graph illustrating an example of an embodiment of a relationship between the input signal IP, or alternately the value of signal 32, and the value of the output signal OP formed by circuit 10 in response to those values. The abscissa indicates values of the input signal IP (or alternately signal 32) and the ordinate illustrates the value of the output signal OP. A plot 67 illustrates an example of an embodiment of the value of OP. As will be seen further hereinafter, a plot 68 illustrates in a dashed line format an example of some values that may be used as an estimated value of signal OP.

The value of IP ranges from a maximum negative value illustrated at a point A to a maximum positive value illustrated at a point F. For the example embodiment illustrated in FIG. 2, the differential embodiment may include that the values of IP, IN, OP, and ON are relative to a common mode voltage 28 of circuit 10. The signals may be referenced to another voltage in other embodiments, such as for example the voltage on return 27 or alternately a ground reference.

Channel 15 may include an adjustment circuit 34 that is configured to receive first signal 32. In one non-limiting example embodiment, circuit 10 may be implemented as one stage of a pipeline ADC and this stage may use two decision levels to form the in the A/D (35) and D/A (36) then FIG. In an embodiment of a stage of a pipelined ADC, circuit 34 may be configured to quantities the value of signal IP for the particular stage of the ADC as is well known in the art. The quantization may form signal 39 to have the waveform illustrated by plot 67 of FIG. 2. Circuit 34 may have an embodiment that may include an analog-to-digital converter circuit 35 that receives first signal 32, converts it to a digital signal, and adjust the digital value to form a signal 37 representing a value of signal IP. Channel 15 may also include a digital-to-analog converter circuit 36 that receives the adjusted digital value of signal 37 and forms an analog signal that can be subtracted from first signal 32 by a summing circuit 38 thereby forming adjusted signal 39. Adjusted signal 39 may have a value that quantities the value of signal IP. Those skilled in the art will appreciate that the illustrated values of IP and the different ranges of signal IP signal are examples only and that IP can have other values and circuit 35 may have other selection ranges of the input signal.

Channel 15 may also have an embodiment that includes a pre-drive circuit 40. An embodiment of circuit 40 may be configured to receive the signal that is representative of the input signal, such as for example signal 32, and predict or estimate the value of the output signal OP that may be formed by amplifier 17 in response to the value signal IP, such as for example in response to receiving the value of signal 39 that is representative of signal IP. An embodiment of circuit 40 may be configured to apply the predicted or estimated value to output 18 of amplifier 17 in order to force or pre-drive or drive output 18 to the estimated value thereby reducing the time required for amplifier 17 to drive outputs 18 and 21 to the value of OP. In some embodiments, circuit 40 may force or pre-drive or drive output 18 to the estimated value before amplifier 17 can form the full value of the output signal on output 18. Those skilled in the art will appreciate that an embodiment of amplifier 17 may be formed to have a high output impedance which may assist in pre-driving output 18 to the estimated value. Those skilled in the art will appreciate that such a high impedance may be a characteristic of telescopic and folded cascode operational transconductance amplifiers. The high impedance may have an embodiment that is no less than approximately one hundred kilo (100K) ohms. In another embodiment the high impedance may be no less than approximately one meg-ohm. In another embodiment, the high impedance may have a value between one hundred kilo (100K) ohms and one meg-ohm.

An embodiment of circuit 40 may be configured to receive signal 32 and estimate the value of the output signal OP in response to the value of input signal IP. Circuit 40 may be a mixed signal circuit that includes digital circuitry that forms a digital signal and adjusts the value of the digital signal to estimate the value of the output signal OP or may be an analog circuit that forms analog signals that estimate the value of output signal OP. In one example embodiment, circuit 40 may include a monitor circuit 41 that may include an analog-to-digital converter that forms a digital signal 42 that is representative of the value of input signal IP or alternately of signal 32. Circuit 40 may also include a digital logic circuit or logic 43 that manipulates digital signal 42 and forms a digital signal 45, such as for example an n-bit binary word having a value, that is the estimated value of output signal OP. A drive circuit 46 of circuit 40 may have an embodiment of that may include a digital-to-analog converter circuit that forms an analog signal on an output 48 of circuit 46 such that the analog signal may be representative of the estimated value of output signal OP. In another embodiment, circuit 40 may be an analog circuit. For example, monitor circuit 41 may be an amplifier circuit and logic circuit 43 may be circuitry, including analog circuits that adjust the value of the output of circuit 41 to form the analog signal that is representative of the estimated value of output signal OP at output 48.

In an embodiment, circuit 40 may be configured to store the estimated value on a capacitor 50 and to subsequently connect capacitor 50 to output 18 to force output 18 to the estimated value. In some embodiments, after being connected to output 18, capacitor 50 may share charge with other capacitors. Thus, the voltage applied to capacitor 50 may be increased to allow for the charge sharing and still drive output 18 to the estimated value. Alternately, circuit 40 may be configured to connect output 48 to output 18 to force output 18 to the estimated value, for example switch 49 may be configured to selectively connect output 48 to output 18. In some embodiments, capacitor 50 may be omitted.

Referring back to FIG. 2, circuit 40 may have an embodiment that forms the estimated value as one of a plurality of discrete values for a range of IP values or for a range of OP values. For example, FIG. 2 illustrates one example of nine ranges of estimated values for the full range of IP values. Since in one embodiment of circuit 10, plot 67 may have three similar segments, the same three output estimates can be used for all three segments. Those skilled in the art will appreciate that plot 67 is an example embodiment, thus, this number of segments may not be appropriate for other embodiments. For example, if IP is between points A-D or alternately between D-E or alternately between E-F the value of OP may be estimated to be somewhere between values 200-206. For example, if IP is between values A-B, circuit 40 may be configured to predict the value of OP to be between values 200-201 and circuit 40 may be configured to form a first estimated value at a value 201. If IP is between values B-C, circuit 40 may be configured to predict the value of OP to be between values 202-204 and circuit 40 may be configured to form a second estimated value at a value 203. If IP is between values C-D, circuit 40 may be configured to predict the value of OP to be between values 204-206 and circuit 40 may be configured to form a third estimated value at a value 205.

Figure 3:
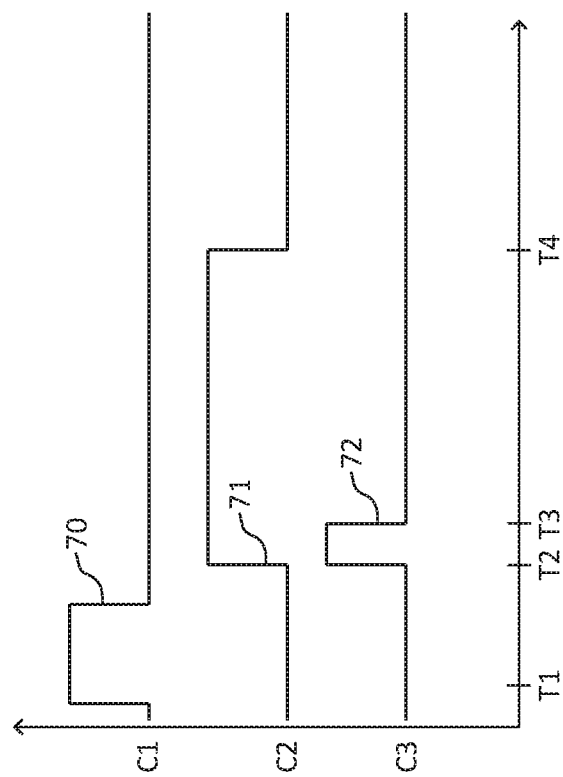
FIG. 3 is a graph having plots that illustrate some signals that may be utilized in the operation of an embodiment of the circuit of FIG. 1 in accordance with the present invention.

FIG. 3 is a graph having plots that illustrate some signals that may be utilized in the operation of an embodiment of circuit 10. The abscissa indicates time and the ordinate indicates increasing value of the illustrated signal. A plot 70 illustrates a control signal C1, and a plot 71 illustrates a control signal C2. Circuit 10 may include an embodiment that forms signals C1 and C2 such that C1 and C2 are not asserted at the same time. A plot 72 illustrates a control signal C3. An embodiment of signal C3 may be asserted during a portion of the time that control signal C2 is asserted.

Assume for example that at a time T1 signal C1 is asserted and signals C2 and C3 are and have previously been negated. In one embodiment, circuit 31 may be configured to sample and hold the input signal IP to form first signal 32 during the first time interval, such as for example the time interval that signal C1 is asserted. During the first time interval an embodiment of amplifier 17 may be configured as a transconductance amplifier and may not receive a signal to amplify from channels 15 and/or 16. For example, a switch 52 may be configured to connect one terminal of capacitor 53 to receive input signal IP and a switch 54 may be configured to connect another terminal of capacitor 53 to receive a voltage, such as for example common mode voltage 28 or alternately another common voltage such as for example a ground reference.

During the first time interval, circuit 40 may be configured to form the estimated value and to connect one terminal of capacitor 50 to receive the estimated signal from circuit 46 and charge capacitor 50 to a voltage that is representative of the estimated value. For example, a switch 49 may connect a first terminal of capacitor 50 to output 48 of circuit 40 in response to asserting the first time interval.

Circuit 10 may be configured to form a second time interval after the expiration of the first time interval. For the example, just prior to a time T2 of FIG. 3, circuit 10 may negate the first time interval, such as for example negate control signal C1, and thereafter assert the second time interval, such as for example assert control signal C2. Negating the first time interval may cause circuit 31 to hold the received input signal IP value as first signal 32. Asserting the second time interval may cause switches 52 and 54 to couple feedback capacitor 53 to the respective output and input of amplifier 17 to form amplifier 17 as a gain stage amplifier. Amplifier 17 may begin receiving the adjusted signal 39 and after some delay begin amplifying signal 39. Circuit 10 may also, in an embodiment, form a third time interval during a portion of the second time interval such as for example may assert a third control signal C3 during a portion of the second time interval. In an embodiment, signal C3 or the third time interval may be asserted substantially simultaneously with the second time interval or alternately may be asserted at some time after the beginning of the second time interval. In response to the third time interval, switch 49 may be configured to force output 18 to the estimated value of output signal OP. For example, switch 49 may connect one terminal of capacitor 50 to output 18 of amplifier 17 in order to force output 18 to the estimated value of output signal OP. In an embodiment, negating the third time interval before the end of the second time interval may give faster settling time because capacitor 50 only loads output 18 for a short period of time.

Referring back to FIG. 2, forcing output 18 to the estimated value quickly drives output 18 to the estimated value thereby reducing the amount of time required for amplifier 17 to form output signal OP in response to receiving signal 39. Assume for example that the value of IP is at point D (FIG. 2), thus, signal 32 will be a negative value relative to the common mode signal. Consequently, connecting capacitor 53 across amplifier 17 would tend to force output 18 and output signal OP negative. However, as shown by plot 67 output OP should be a positive value and not a negative value. Because circuit 40 forms the estimated value of signal OP illustrated by value 203 in plot 68, the pre-drive signal quickly forces output OP to the estimated value illustrated by value 203. Thus, amplifier 17 merely has to drive outputs 18 and 21 to the difference between the value 203 and the actual output value 204. As would be understood by one skilled in the art, the pre-drive signal quickly forces the output of amplifier 17 to the estimated value which reduces the amount of time required for output OP to form the actual output voltage value.

Those skilled in the art will appreciate that channel 16 may be formed to include circuits and operation substantially the same as 15 except that channel 16 is connected to output 19 in order to form an estimated value of output voltage ON of output 19 of amplifier 17 and to force or pre-drive or drive output 19 to the estimated value in a manner similar to channel 15.

Figure 4:
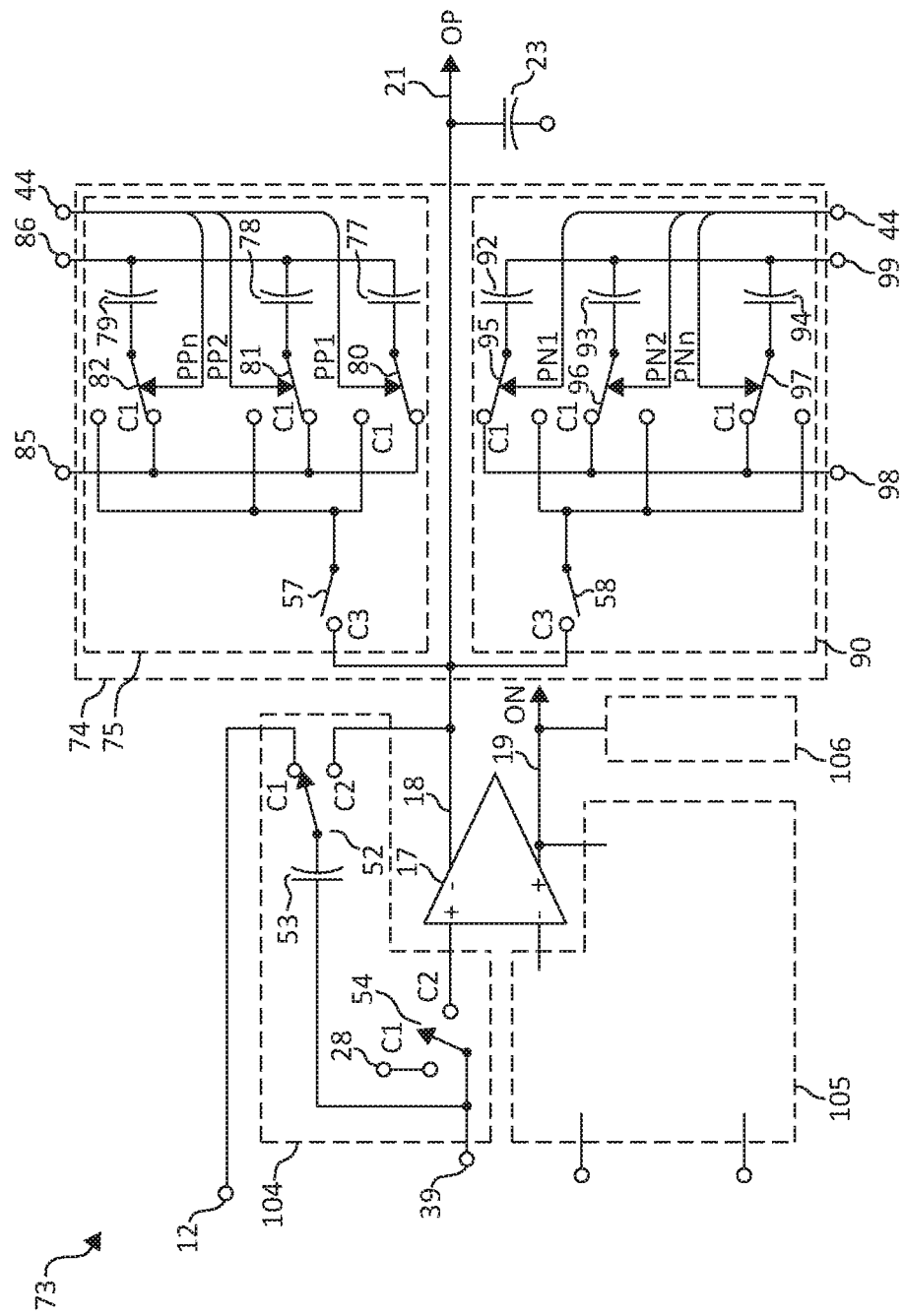
FIG. 4 schematically illustrates an example of a portion of an embodiment of an amplifier circuit that may be an alternate embodiment of portions of the circuit of FIG. 1 in accordance with the present invention.

FIG. 4 schematically illustrates an example of a portion of an embodiment of an amplifier circuit 73 that may be an alternate embodiment of portions of circuit 10 that was explained in the description of FIGS. 1-3. Circuit 73 includes a drive circuit 74 that may include an embodiment that may be an alternate embodiment of circuit 46, switch 49, and capacitor 50 of circuit 40 in FIG. 1. In some embodiments, circuit 74 may be referred to as a capacitive digital-to-analog converter. Circuit 74 may have an embodiment that may include a positive drive circuit 75 and a negative drive circuit 90. An embodiment of circuit 75 may be configured to drive output 18 toward a positive voltage, and an embodiment of circuit 90 may be configured to drive output 18 for a negative voltage, such as for example a negative relative to a common mode voltage. Circuit 75 may include a plurality of capacitors 77-79, a plurality of corresponding control switches 80-82 that are controlled by a plurality of output P control signals PP1-PPn. In this signal name convention, the first P represents output OP, the second P indicates the positive circuit 75, and the number indicates which number of the n number of capacitors is being controlled. Circuit 75 may also include an optional switch 57 that may be configured to operate similarly to switch 49 of FIG. 1. One terminal of capacitors 77-79 is connected to a voltage input 86, and another terminal of capacitors 77-79 are selectively switched between a voltage input 85 and output 18 of amplifier 17. In one embodiment input 85 may receive a positive voltage greater than the common mode voltage and input 86 may be substantially the common mode voltage. In another embodiment, input 85 may be a positive voltage that is greater than the common mode voltage and input 86 may be any positive voltage as long as the value thereof is substantially constant. An embodiment may include that the voltage on inputs 85 and 86 are substantially the same.

An embodiment of circuit 90 may include a plurality of capacitors 92-94 and a plurality of corresponding control switches 95-97 that are controlled by a plurality of corresponding output P control signals PN1-PNn. In this signal name convention, the P represents output OP, the N indicates negative circuit 90, and the number indicates which number of the n number of capacitors is being controlled. Circuit 90 may include an optional switch 58 that may be configured to operate similarly to switch 49 of FIG. 1. One terminal of capacitors 92-94 is connected to a voltage input 99 and another terminal of capacitors 92-94 is selectively switched between a voltage input 98 and output 18. In one embodiment, input 98 may receive a voltage that is less than the common mode voltage and input 99 may receive substantially the common mode voltage. In another embodiment, input 98 may receive a voltage less than the common mode voltage and input 99 may receive any other voltage that is less than the common mode voltage as long as the value thereof is substantially constant. An embodiment may include that the voltage on inputs 98 and 99 are substantially the same.

An embodiment of circuit 75 may be configured such that in response to the first time interval, switches 80-82 connect one terminal of capacitors 77-79 to receive the voltage from input 85 and charge capacitors 77-79 with the voltage between inputs 85 and 86. Similarly, an embodiment of circuit 90 may be configured such that in response to the first time interval, switches 95-97 connect one terminal of capacitors 92-94 to receive the voltage from input 98 and charge capacitors 92-94 with the voltage between inputs 98 and 99. For an embodiment wherein the voltage on inputs 85 and 86 are substantially similar and the voltage on inputs 98 and 99 are substantially similar, such a configuration may minimize transients on the power supply voltages and voltage returns which may improve the noise rejection of circuit 10. In response to the second time interval, or in some embodiments in response to the third time interval, circuit 75 may be configured to selectively couple some of capacitors 77-79 to output 18 through switch 57 or alternately circuit 90 may be configured to selectively couple some of capacitors 92-94 to output 18 through switch 58. The number of capacitors that are selectively connected to output 18 is selected in response to the estimated value of the output voltage. For example, logic 43 (FIG. 1) may calculate or determine the estimated output voltage value. If circuit 10 determines that OP is to be a positive value, for example relative to the common mode voltage, circuit 10 may be configured to assert appropriate ones of signals PP1-PPN that provide sufficient voltage to drive output 18 to the estimated value. Similarly, if circuit 10 determines that OP is to be a negative value, for example relative to the common mode voltage, circuit 10 may be configured to assert appropriate ones of signals PN1-PNn to selectively connect sufficient numbers of capacitors 92-94 to output 18 in order to form the estimated value on output 18.

An embodiment of circuit 73 may include that the capacitors of circuit 74 may have to share charge with capacitors internal to channel 15, such as for example switched capacitors of other circuitry selectively connected to amplifier 17, as well as parasitic capacitors. For example, when switch 57 closes, the charge from the capacitors selected by control signals 44 may share their charge with all the intentional and parasitic capacitors connected to output 18. The charge from capacitor 53 is also shared with all other capacitors because the rising edges of control signals C2 and C3 may be coincident in time. If the control signal causes the capacitance that connects through switch 57 to be K*Cunit, then output 18 will be pre-driven as follows:

$$V(18)=V(T0)+V(85)*k*Cunit+V(12)*C(53)/(k*Cunit+C(53)+C(23)+C(18)) \quad \text{Equation (1)}$$

Where:
  V(18)=the voltage on output 18,
  V(T0)=the initial voltage on the capacitors,
  V(85)=the voltage on input 85,
  V(12)=the value of IP,
  C(53)=the value of capacitor 53,
  C(23)=the value of capacitor 23, and
  C(18)=the value of all other capacitors on output 18.

Since an embodiment may include that the parasitic capacitance may be nonlinear and difficult to predict, the value of k*Cunit for each input voltage segment may be determined iteratively using a circuit simulator and parasitic capacitance calculated from the integrated circuit layout. In an embodiment, there may be switches and capacitors on the input amplifier 17 and on the input of the next stage that may be connected to output 18 and these next stage capacitances may also contribute to the total charge sharing. The number of capacitors selected to be connected to output 18 may be selected to compensate for such parasitic capacitances and other capacitors connected to amplifier 171.

Connecting one or more of capacitors 77-79, or alternately capacitors 92-94, to output 18 capacitively connect output 18 to the voltage source on input 86, or alternately input 99. The capacitive value of the connected capacitors control the voltage to which output 18 is driven to in the time interval that the capacitors are connected. Thus, the number of selected capacitors control the capacitance value of the parallel connected capacitors that are connected to output 18, thus, the value of the estimated signal to which output 18 is driven.

The capacitance values of capacitors 77-79 and 92-94 may all be the same value, or may be different values. In one embodiment, the set of capacitors 80-82 may have binary weighted values relative to each other, and the set of capacitors 95-97 may also have weighted binary values relative to each other. Inputs 85 and 85 may be shorted together in an embodiment, and an optional embodiment may include that inputs 98 and 99 may be shorted together.

Circuit 73 may include another drive circuit 106 that is substantially the same as drive circuit 74 except that circuit 106 and the capacitors therein are connected to output 19 in order to form an estimated value of output voltage ON of output 19 of amplifier 17 and to force or pre-drive or drive output 19 to the estimated value in a manner similar to circuit 74 driving output 18. Some embodiments of the amplifier circuit may also include a feedback circuit 105 that may be substantially similar to feedback circuit 104 of amplifier circuit 73. The description of circuit 106 may be the same as the description for circuit 74 except that output 18 and OP is replaced by output 19 and ON, respectively. Additionally, control signals PP1-PPn and PN1-PNn would be replaced with NP1-NPn and NN1-NNn, respectively to indicate control signals for output ON.

Those skilled in the art will appreciate that an embodiment of circuit 73 may include that a first terminal of capacitor 79 is commonly connected to input 86, a first terminal of capacitor 78, and a first terminal of capacitor 77. A second terminal of capacitor 78 is connected to a first terminal of switch 81 and a second terminal of capacitor 79 is connected to a first terminal of switch 82. A second terminal of switch 82 is commonly connected to input 85, a second terminal of switch 81, and a second terminal of switch 80. A third terminal of switch 82 is commonly connected to a third terminal of switch 81, a third terminal of switch 80, and a first terminal of switch 57, or alternately to output 18. A second terminal of switch 57 is connected to output 18. A first terminal of capacitor 92 is commonly connected to a first terminal of capacitor 93, a first terminal of capacitor 94, and input 99. A second terminal of capacitor 92 is connected to a first terminal of switch 95 and a second terminal of capacitor 93 is connected to a first terminal of switch 96. A second terminal of capacitor 94 is connected to a first terminal of switch 97. A second terminal of switch 97 is commonly connected to input 98, a second terminal of switch 96, and a second terminal of switch 95. A third terminal of switch 95 is commonly connected to a third terminal of switch 96, a third terminal of switch 97, and a first terminal of switch 58 or alternately to output 18. A second terminal of switch 58 is connected to output 18. Output 18 is connected to a first terminal of capacitor 23.

Figure 5:
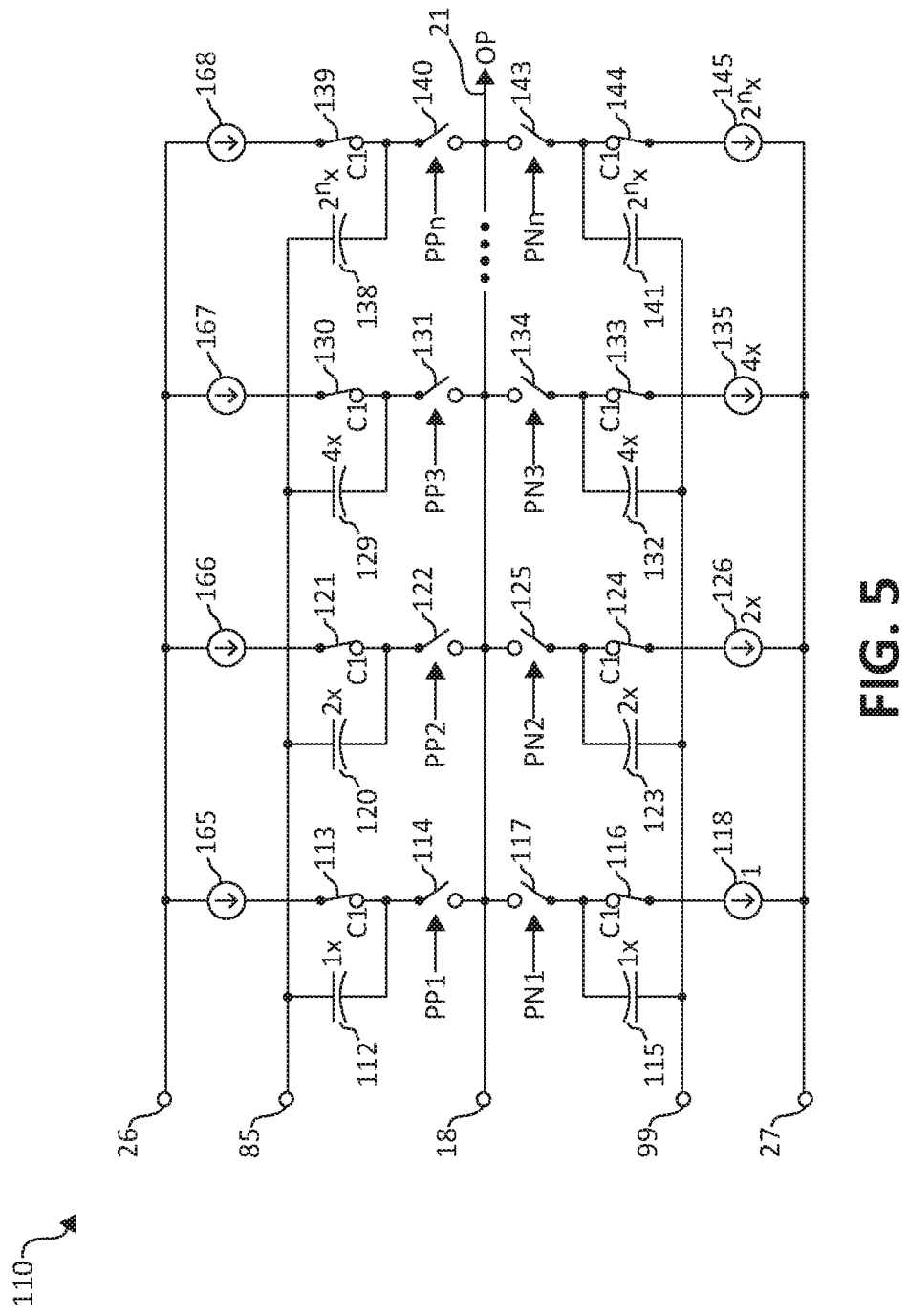
FIG. 5 schematically illustrates an example of a portion of an embodiment of a circuit that may be an alternate embodiment of some of the circuits of FIG. 4 in accordance with the present invention.

FIG. 5 schematically illustrates an example of a portion of an embodiment of a circuit 110 that may be an alternate embodiment of circuit 74 (FIG. 4). Circuit 110 includes a plurality of capacitors 112, 120, 129, 138 that are configured to drive output 18 to a positive estimated value, and a plurality of capacitors 115, 123, 132, and 141 that are configured to drive output 18 to a negative estimated value. Switches 113, 121, 130, 139, 116, 124, 133, and 144 may be included in an embodiment of circuit 110. Circuit 110 may have an optional embodiment that may include current sources 165-168. For the embodiment that does not include current sources 165-168, the terminal of the switch that is illustrated as connected to a current source may be connected to input 85 or alternately to input 26. In an embodiment, the set of capacitors 112, 120, 129, and 138, and the set of capacitors 115, 123, 132, and 141 may be binary weighted capacitance values such that each capacitor within a set is a binary multiple of the adjacent capacitor within that set. In other embodiments, the capacitance values may all be the same or may have other values relative to each other. Circuit 110 may be configured such that in response to the first time interval, such as for example the asserted state of the first time interval or the asserted state of control signal C1, switches 113, 121, 130, 139, 116, 124, 133, and 144 are closed and are open in response to the negated state of the first time interval or of signal C1. During the first time interval, control signals PP1-PPn and PN1-PNn are negated such that switches 114, 122, 131, 140, 117, 125, 134, and 143 are open. Thus, capacitors 112, 120, 129, and 138 are discharged and capacitors 115, 123, 132, and 141 are charged through optional respective current sources 118, 126, 135, and 145. For example, current sources 118, 126, 135, and 145 may be replaced by a short circuit. In one non-limiting embodiment, inputs 85 and 99 may be driven from an amplifier having a gain and whose input is a reference voltage value, with a different reference voltage for each of inputs 88 and 99. The connections of the switches and current sources of circuit 110 may be configured to minimize current on the outputs of those amplifiers. An embodiment of the current sources may be implemented by FETs or bipolar transistors or in such a manner that the current in the current source decreases and eventually goes to substantially zero when the voltage across the source discharges to substantially zero.

In response to the asserted state of the third time interval or alternately of control signal C3, some of signals PP1-PPn may be asserted to close selected ones of switches 114, 122, 131, or 140 in order to drive output 18 to a positive value if the estimated value is positive, or alternately some of signals PN1-PPn may be asserted to close selected ones of switches 117, 125, 134, or 143 in order to drive output 18 to a negative value if the estimated value is negative, for example negative relative to a common mode voltage. Logic 43 (FIG. 1) may be configured to assert the selected ones of the control signals in response to the estimated value formed by the pre-drive circuit. Closing one of switches 114, 122, 131, or 140 pulls output 18 toward the value of the voltage on input 85 through the respective selected capacitor. Alternately, closing one of switches 117, 125, 134, 143 pulls output 18 toward the negative voltage on input 99 through the selected respective capacitor. The selection of the weighted capacitors is made based on the amount of capacitance needed to move output 18 to the estimated value in the time interval that they are connected to output 18. An embodiment of circuit 110 may include that outputs 18 and/or 19 may be briefly connected to the common mode voltage just before asserting the third, or alternately the second, time interval so the initial voltage V(T0) shown in Equation (1) is the common mode voltage. The switch resistances and the length of the third time interval may be selected so that all charge sharing settles in the interval before the end of the third time interval. An optional embodiment may include that sources 118, 126, 136, and 145 may be connected to input 98 instead of to return 27. Another embodiment may include that instead of connecting one terminal of switches 113, 121, 130, and 139 to input 85, that terminal of the switches may be connected in series with current sources, one source for each switch, and the sources may be connected to input 26 or alternately to input 86.

Those skilled in the art will appreciate that a similar circuit to circuit 110 may be used instead for circuit 106 illustrated in FIG. 5. The similar circuit would be connected to output 19. The description thereof would be substantially similar to the description of circuit 110 except that OP and output 18 would be replaced with output ON and output 19, respectively, and that control signals PP1-PPn and PN1-PNn would be replaced with NP1-NPn and NN1-NNn, respectively.

Those skilled in the art will appreciate that an embodiment of circuit 110 may include that a first terminal of capacitor 112 may be commonly connected to input 85, a first terminal of switch 113, a first terminal of switch 120, a first terminal of switch 121, a first terminal of capacitor 129, a first terminal of switch 130, a first terminal of capacitor 138, and a first terminal of switch 139. A second terminal of capacitor 112 may be connected to a second terminal of switch 113 and a first terminal of switch 114. A second terminal of capacitor 120 is commonly connected to a second terminal of switch 121 and a first terminal of switch 122. A second terminal of capacitor 129 is commonly connected to a second terminal of switch 130 and a first terminal of switch 131. A second terminal of capacitor 138 is commonly connected to a second terminal of switch 139 and a first terminal of switch 140. A second terminal of switch 140 is commonly connected to output 18, a first terminal of switch 143, a second terminal of switch 131, a first terminal of switch 134, a second terminal of switch 122, a first terminal of switch 125, a second terminal of switch 114, and a first terminal of switch 117. A second terminal of switch 117 is commonly connected to a first terminal of switch 116 and a first terminal of capacitor 115. A second terminal of switch 125 is commonly connected to a first terminal of capacitor 123 and a first terminal of switch 124. A second terminal of switch 134 is commonly connected to a first terminal of capacitor 132, and a first terminal of switch 133. A second terminal of switch 143 is commonly connected to a first terminal of capacitor 141 and a first terminal of switch 144. A second terminal of switch 144 is connected to a first terminal of current source 145. A second terminal of switch 133 is connected to a first terminal of current source 135. A second terminal of switch 124 is connected to a first terminal of current source 126. A second terminal of switch 116 is connected to a first terminal of current source 118. A second terminal of capacitor 115 is commonly connected to input 18, a second terminal of capacitor 123, a second terminal of capacitor 132, and a second terminal of capacitor 141. A second terminal of current source 118 is commonly connected to input 27, a second terminal of current source 126, a second terminal of current source 135, and a second terminal of current source 145.

Figure 6:
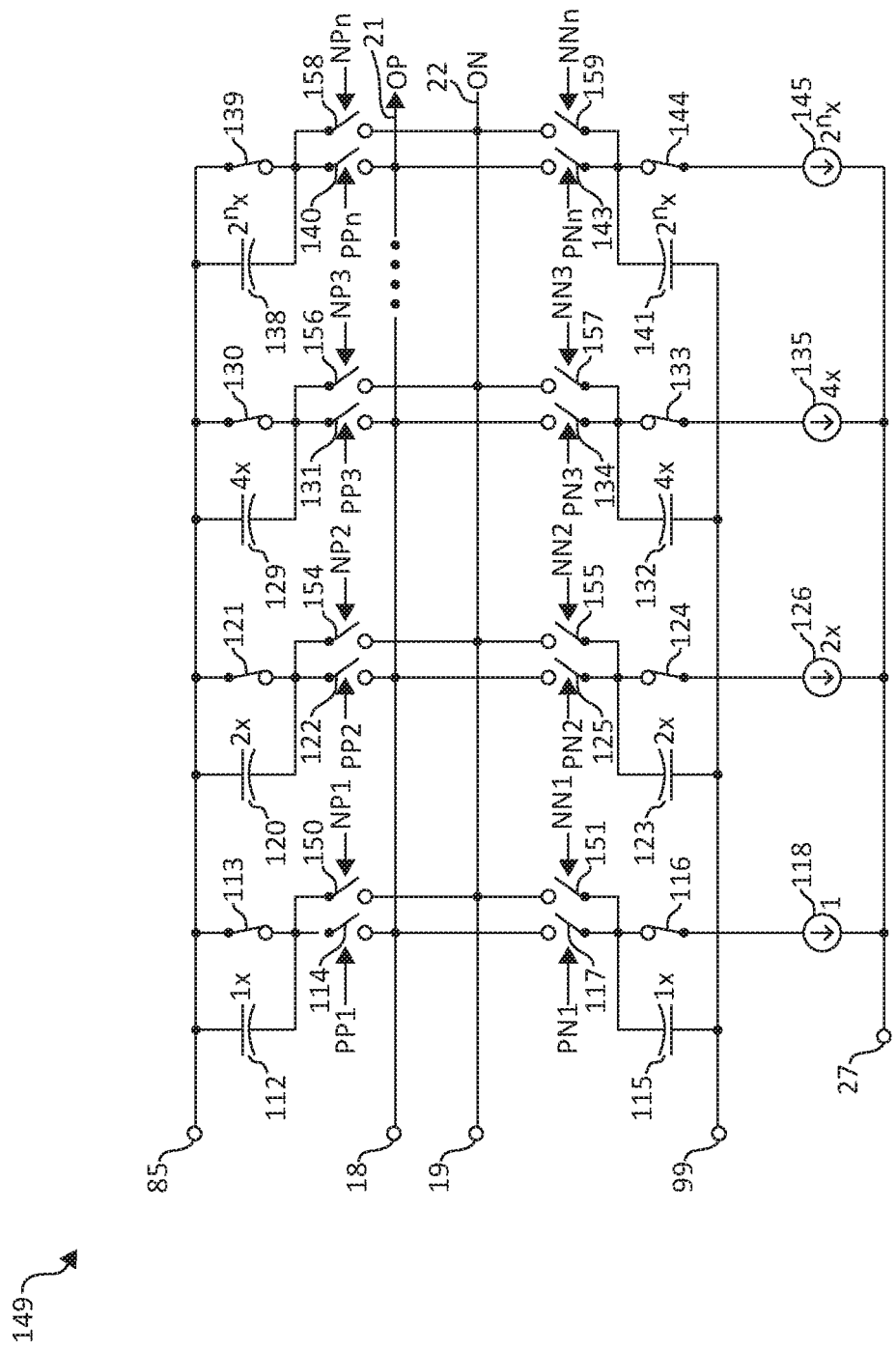
FIG. 6 schematically illustrates an example of a portion of an embodiment of a drive circuit that may be an alternate embodiment of some of the circuits of FIG. 4 or FIG. 5 in accordance with the present invention.

FIG. 6 schematically illustrates an example of a portion of an embodiment of a drive circuit 149 that may be an alternate embodiment of circuit 74 and 106 of FIG. 4 or of circuit 110 and the corresponding circuit on output 19 of FIG. 5. An embodiment of circuit 149 may also optionally include current sources 165-168 that were explained in the description of FIG. 4. Referring back to FIG. 5, one skilled in the art will appreciate that only one set of capacitors is used during any time interval to drive output 18 to either a positive or a negative value, and only one set of capacitors (not show) is used to drive output 19 to a negative estimated value during that same time interval. For example, if output 18 is driven to a negative value capacitors 115, 123, 132, and 141 are used to drive output 18 and capacitors 112, 120, 129, and 138 are not connected to output 18 during that particular cycle. Additionally, output 19 will be driven to an opposite value to that of output 18, for example if output 18 is driven to a negative value output 19 may be driven to a positive value. Consequently, instead of having two circuits such as circuit 110, one for output 18 and one for output 19, the capacitors of circuit 110 along with a few extra switches may be used for both outputs 18 and 19, as illustrated by circuit 149. Switches 150, 154, 156, and 158 may be added to selectively connect output 19 to one of respective capacitors 112, 120, 129, or 138, and also switches 151, 155, 157, and 159 may be added to selectively connect output 19 to one of respective capacitors 115, 123, 132, or 141. Circuit 149 may have alternate embodiments that may include changing the connections to inputs 85, 99, and 27 in the same manner as explained for circuit 110.

In operation, during the first time interval the capacitors of circuit 149 are charged as explained in the description of FIG. 5. In response to the second time interval or alternately the third time interval, the output control switches are selectively enabled to connect the selected ones of the set of capacitors 112, 120, 129, or 138 to one of outputs 18 or 19, and connect the selected ones of the set of capacitors 115, 123, 132, and 141 to the other of outputs 18 or 19 in order to drive outputs 18 and 19 to the estimated value.

Those skilled in the art will appreciate that an embodiment of circuit 149 may include that a first terminal of switch 150 is connected to the second terminal of capacitor 112, and a second terminal of switch 150 is commonly connected to output 19 and a first terminal of switch 151. A second terminal of switch 151 is connected to the first terminal of capacitor 115. A first terminal of switch 154 is connected to the second terminal of switch 120, and a second terminal of switch 154 is commonly connected to output 19 and a first terminal of switch 155. A second terminal of one of switch 155 is connected to the first terminal of capacitor 123. A first terminal of switch 156 is connected to the second terminal of capacitor 129, and a second terminal of switch 156 is commonly connected to output 19 and a first terminal of switch 157. A second terminal of switch 157 is connected to the first terminal of capacitor 132. A first terminal of switch 158 is connected to the second terminal of capacitor 138, and a second terminal of switch 158 is commonly connected to output 19 and a first terminal of switch 159. A second terminal of switch 159 is connected to the first terminal of capacitor 141.

Figure 7:
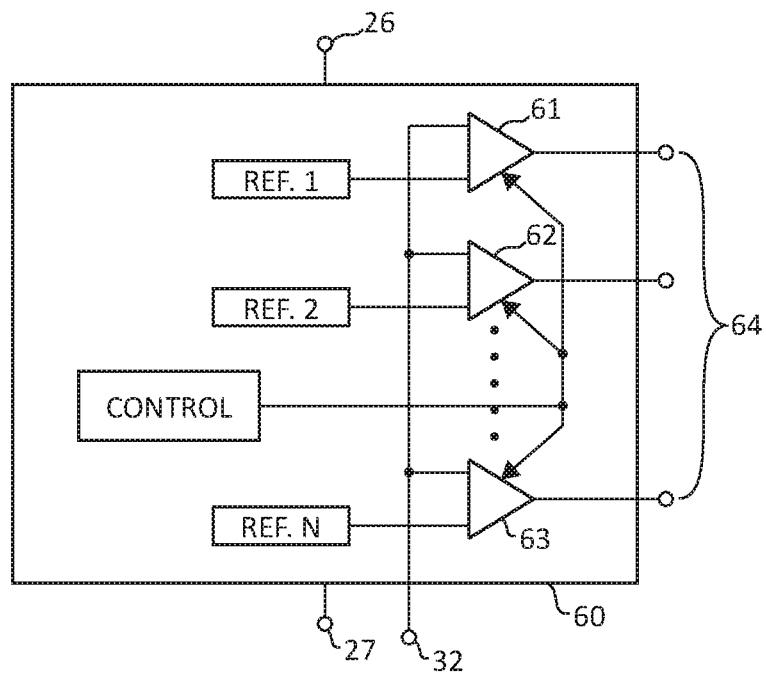
FIG. 7 schematically illustrates an example of a portion of an embodiment of a circuit that may be an alternate embodiment of portions of the circuit of FIG. 1 in accordance with the present invention.

FIG. 7 schematically illustrates an example of a portion of an embodiment of an analog-to-digital converter circuit 60 that may be an alternate embodiment of portions of circuits 35 and/or 41 (FIG. 1). Circuit 60 is illustrated as a single-ended circuit but may be a differential circuit in other embodiments. Circuit 60 includes a plurality of comparators 61-63 that are configured to compare the received signal, such as for example signal 32, to a plurality of reference signals from references Ref.1-Ref.N and form a digital word 64 representing the value of the signal received on input 32. Another example of an analog-to-digital circuit is described in a patent application entitled "METHOD OF FORMING A SEMICONDUCTOR DEVICE AND STRUCTURE THEREFOR" that is filed concurrently herewith, Ser. No. 15/232,248 and common inventor Donald Claude Thelen, Jr., which is hereby incorporated herein by reference.

Figure 8:
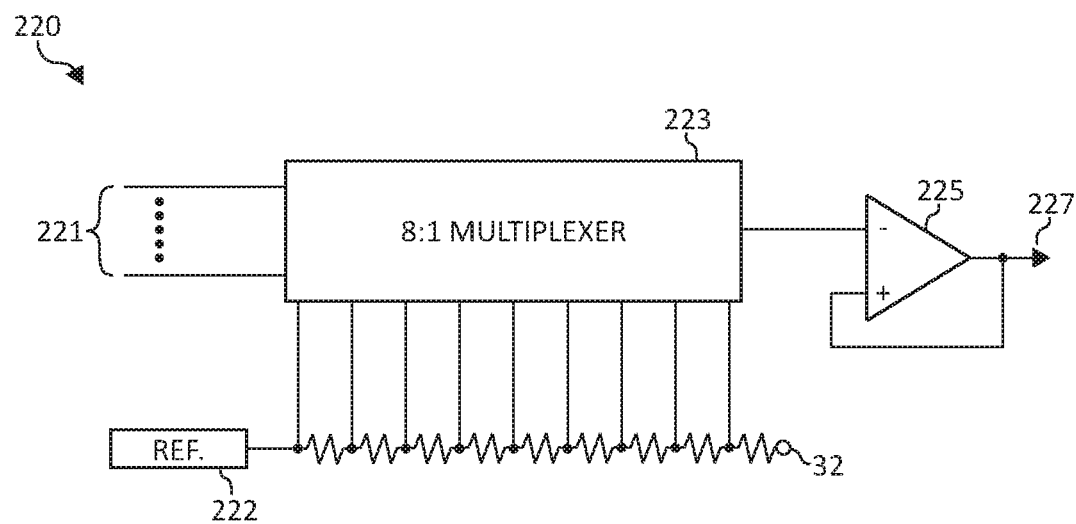
FIG. 8 schematically illustrates an example of a portion of an embodiment of another circuit that may be an alternate embodiment of portions of the circuit of FIG. 1 in accordance with the present invention.

FIG. 8 schematically illustrates an example of a portion of an embodiment of a digital-to-analog converter circuit 220. Circuit 220 may have an embodiment that may be an alternate embodiment of circuit 36 (FIG. 1). Circuit 220 may include a reference voltage generator or reference 222 that forms a substantially dc reference signal. Resistors are used to form various reference voltages that have a lower voltage than the output of reference 222. A multiplexer 223 may be configured to receive a digital input signal 221 and select one of the reference signals from the resistors to form an analog output signal 227 that is representative of the value of the received digital signal. An optional amplifier 225 may amplify signal 227 to form an output signal 229.

Figures 9, 10:
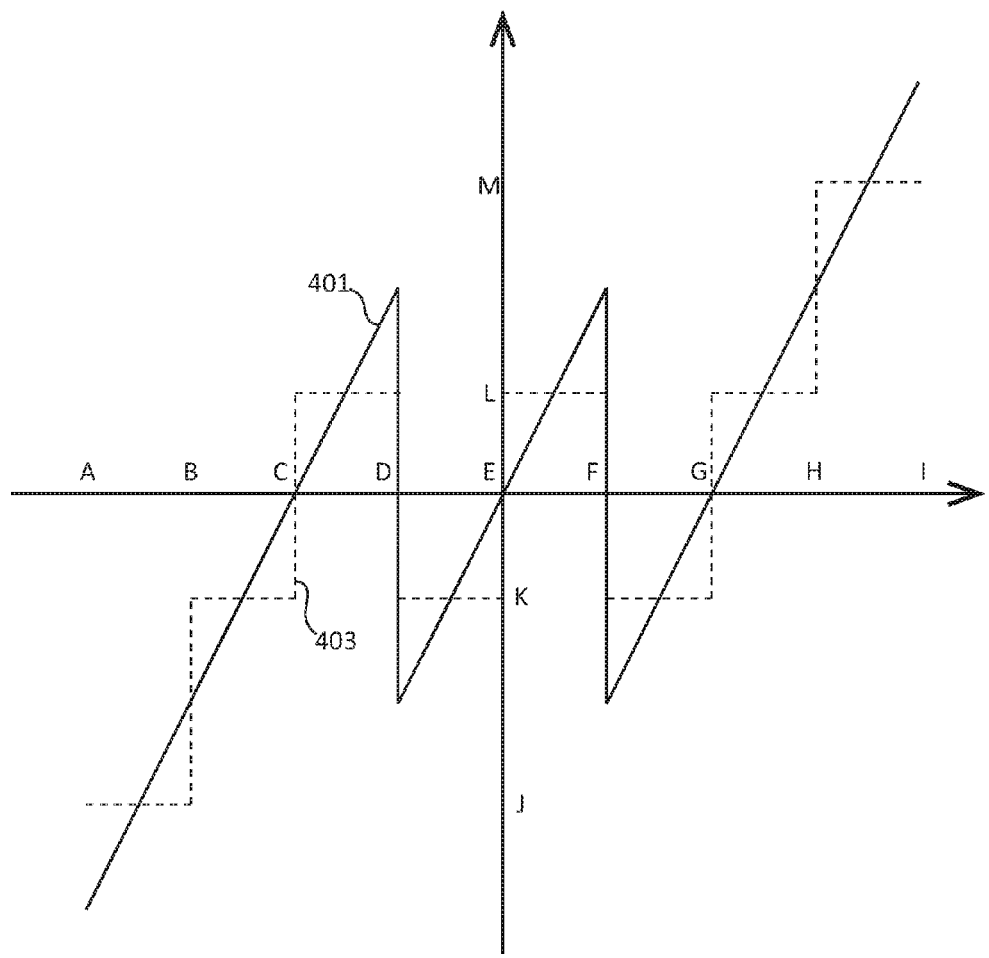
FIG. 9 is a graph illustrating another example of an embodiment of another relationship between the input signal and the value of the output signal that may be formed by the circuit of FIG. 1 in accordance with the present invention.
FIG. 10 is a table illustrating an example of an embodiment of some conditions that may be used to implement logic for some of the circuits of FIG. 1 in accordance with the present invention.

FIG. 9 is a graph illustrating an example of an embodiment of another relationship between the input signal IP, or alternately the value of signal 32, and the value of the output signal OP that may be formed by circuit 10 in response to those values. The abscissa indicates values of the input signal IP (or alternately signal 32) and the ordinate illustrates the value of the output signal OP. A plot 401 illustrates an example of an embodiment of the value of OP. A plot 403 illustrates in a dashed line format an example of some values that may be used as an estimated value of signal OP.

FIG. 10 is a table illustrating an example of an embodiment of conditions that may be used to implement the logic use for logic 43 of FIG. 1. The table of FIG. 10 illustrates some of the signals in the graph of FIG. 9 and corresponding values of capacitors that may be used to form an example of the pre-drive signal. A column 410 illustrates which of quadrants A-I of plot 401 that the example embodiment of signal OP falls into, the column 411 illustrates the value of the output of monitor 41 of FIG. 1. A column 413 illustrates an example embodiment of the pre-drive signal, and a column 415 illustrates an example embodiment of the number of capacitors of circuit 149 (FIG. 6) may be used to form the pre-drive signal. Negative numbers indicate that the pre-drive signal should generate a negative value. Those skilled in the art will appreciate this is just one example embodiment and is used as a vehicle to illustrate how the logic of logic 43 may be formed.

Figure 11:
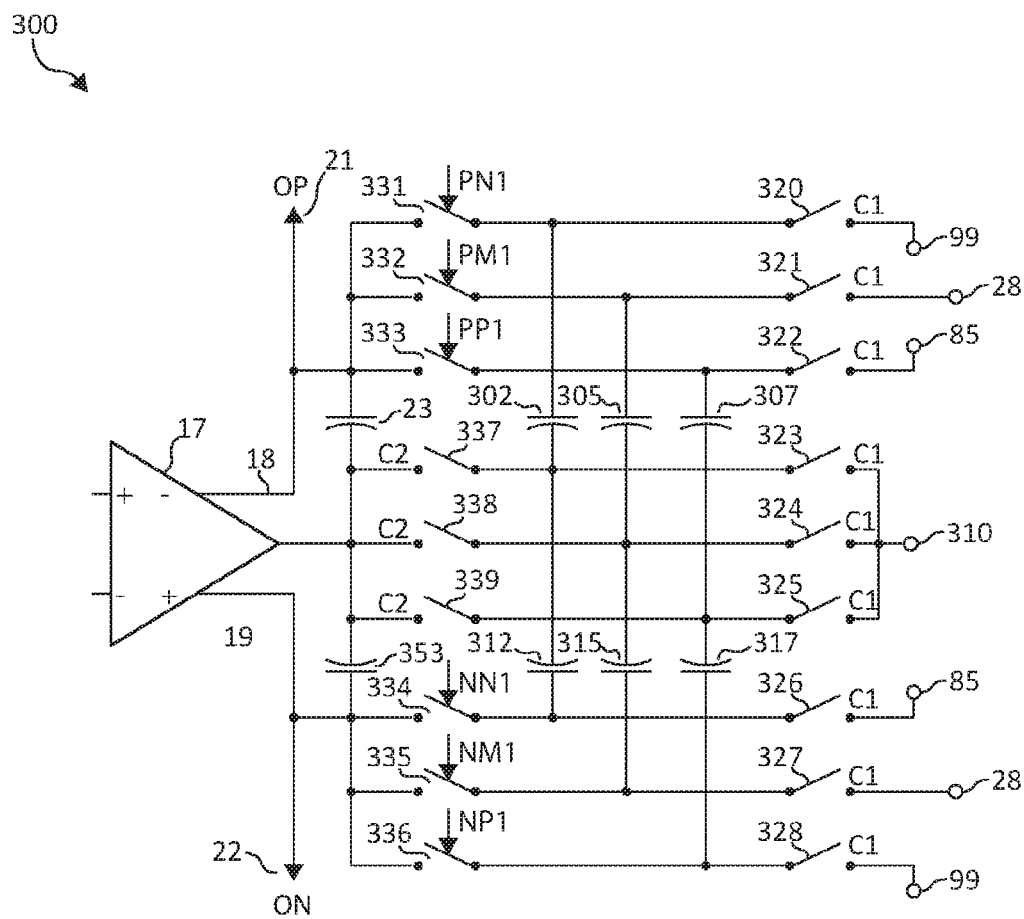
FIG. 11 schematically illustrates an example of a portion of an embodiment of another circuit that may be an alternate embodiment of portions of the circuit of FIG. 1 in accordance with the present invention.

FIG. 11 schematically illustrates an example of a portion of an embodiment of a circuit 300 that may be an alternate embodiment of circuit 74 (FIG. 4) or circuit 110 (FIG. 5) or circuit 149 (FIG. 6). An embodiment of circuit 300 may include capacitors 302, 305, and 307 along with switches 320-322, and switches 331-333 that may be a portion of a positive drive circuit that may be an alternate embodiment of portions of circuit 74 of FIG. 4 or portions of circuit 110 of FIG. 5. An embodiment of circuit 300 may also include capacitors 312, 315, and 317 along with switches 326-328 and switches 334-336 that may be a portion of a negative drive circuit that may be an alternate embodiment of portions of circuit 106 of FIG. 4.

Circuit 300 may be configured to, in response to the asserted first control signal, enable or close switches 320-328 to charge capacitors 302 and 312 to a voltage that will drive outputs 18 or 22 toward a negative value relative to the common mode voltage on input 28, to charge capacitors 307 317 to a voltage that would drive outputs 18 or 22 to a positive value relative to the common mode voltage, in charge capacitors 305 and 315 to a voltage that is near to the common mode voltage. Thereafter, circuit 300 may be configured to negate the first control signal an open or disable switches 320-328. In response to the second control signal, circuit 300 may be configured to enable or close switches 331, 334, and 337 in the event that output 18 needs to be driven to a negative value and output 19 needs to be driven to a positive value relative to the common mode voltage. For the case that output 18 is to be driven to a positive voltage and output 19 is to be driven to a negative voltage relative to the common mode voltage, circuit 300 may be configured to enable or close switches 331, 339, and 334. In some embodiments, circuit 300 may be configured to enable or close switches 332, 338, and 335 to drive both outputs 18 and 19 to a voltage near the common mode voltage.

Those skilled in the art will appreciate that outputs 18 and 19 may be driven to multiple different voltage values. For example, a circuit similar to circuit 300 may include another set of capacitors and switches similar to capacitors 302 and 312 along with another set of switches similar to switches 320, 326, 331, 337, and 334 except that the equivalent of switches 320 and 326 could be configured to receive different voltages instead of the voltage on input 99. For example, the different voltage could be a value somewhere between voltage on inputs 99 and 85. Thus, outputs 18 and 19 could be driven to the other voltage values.

In order to assist in this functionality for circuit 300 may have an embodiment in which a first terminal of switch 331 is commonly connected to a first terminal of switch 3032, a first terminal of switch 333, a first terminal of capacitor 23, and output 18. A second terminal of switch 331 may be commonly connected to a first terminal of switch 330, and a first terminal of capacitors 302. A second terminal of switch 332 may be commonly connected to a first terminal of switch 321 and a first terminal of capacitor 305. A second terminal of switch 333 may be commonly connected to a first terminal of switch 332 and a first terminal of capacitor 307. A second terminal of capacitor 323 to be commonly connected to a first terminal of switch 337, a first terminal of switch 338, a first terminal of switch 339, a first terminal of capacitor 335, and a bias drive input of amplifier 17. A second terminal of switch 337 may be commonly connected to a first terminal of switch 323, a second terminal of capacitor 302, and a first terminal of capacitor 312. A second terminal of switch 338 may be commonly connected to a first terminal of switch 324, a second terminal of capacitor 305, and a first terminal of capacitor 315. A second terminal of switch 339 may be commonly connected to a first terminal of switch 325, a second terminal of capacitor 307, and a first terminal of capacitor 317. A second terminal of capacitor 353 may be commonly connected to output 22, a first terminal of switch 334, a first terminal of switch 335, and a first terminal of switch 336. A second terminal of switch 336 may be commonly connected to a first terminal of switch 328 and a second terminal of capacitor 317. A second terminal of switch 335 may be commonly connected to a first terminal of switch 327 and a second terminal of capacitor 315. A second terminal of switch 334 may be commonly connected to a first terminal of switch 326 and a second terminal of capacitor 312. A second terminal of switch 320 may be commonly connected to input 99 and a second terminal of switch 326. A second terminal of switch 321 may be commonly connected to input 28 and a second terminal of switch 327. A second terminal of switch 322 may be connected to input 85 and a second terminal of switch 328. A second terminal of switch 323 may be commonly connected to a second terminal of switch 324, a second terminal of switch 325, and input 310.

Figure 12:
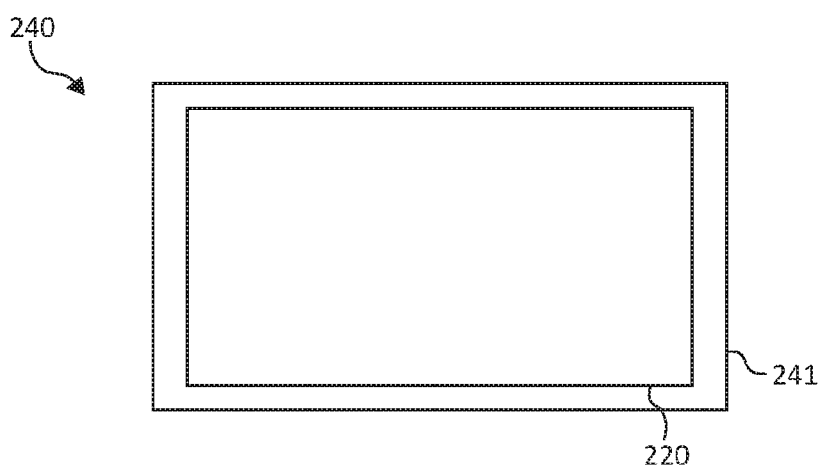
FIG. 12 illustrates an enlarged plan view of a portion of an embodiment of a semiconductor device or integrated circuit that may include portions of the circuit of FIG. 1 and alternates thereof in accordance with the present invention.

FIG. 12 illustrates an enlarged plan view of a portion of an embodiment of a semiconductor device or integrated circuit 240 that is formed on a semiconductor die 241. In an embodiment, any one of circuits 10, 73, 110, 149, 220, or 300 may be formed on die 241. Die 241 may also include other circuits that are not shown in FIG. 9 for simplicity of the drawing. The device or integrated circuit 240 may be formed on die 241 by semiconductor manufacturing techniques that are well known to those skilled in the art.

Those skilled in the art will appreciate that an example of an embodiment a circuit for an analog-to-digital converter may comprise:

a first circuit, such as for example if circuit 31, configured to receive an input signal having an amplitude and form a first signal, such as for example a signal 32, that is representative of the input signal, the first circuit configured to form the first signal during a first time interval;

an amplifier, such as for example amplifier 17, configured to amplify signals having an amplitude that is within a first range of values;

an adjustment circuit, such as for example circuit 34, configured to adjust an amplitude of the first signal to be within the first range of values thereby forming an adjusted signal, such as for example signal 39, that is representative of the input signal;

the amplifier configured to receive the adjusted signal during a second time interval and form an output signal on an output of the amplifier during the second time interval; and a pre-drive circuit, such as for example circuit 40, configured to, during the first time interval, form an estimated value of the output signal and form a pre-drive signal having a value that is substantially the estimated value of the output signal and charge a capacitor with the pre-drive signal, the pre-drive circuit configured to couple the capacitor to the output of the amplifier during a portion of the second time interval but not during the first time interval.

An embodiment of the circuit may be formed to configure the amplifier as a gain stage during the second time interval but not during the first time interval.

In an embodiment, the pre-drive circuit may be configured to form the estimated value as one of a plurality of discrete values.

The circuit may include an embodiment having a digital-to-analog conversion circuit configured to form the pre-drive signal.

Those skilled in the art will appreciate that an embodiment of a method of forming an amplifier may comprise:

configuring the amplifier to receive an input signal;

forming the amplifier, such as for example amplifier 17, to amplify a signal that is within an input range of values, the amplifier having a first output;

configuring an adjustment circuit to adjust an amplitude of the input signal and to form a first signal during a first time interval wherein the first signal has an amplitude that is within the input range and is representative of the input signal;

forming the amplifier to receive the first signal and to responsively form a first output signal on the first output during a second time interval but not during the first time interval; and configuring a first pre-drive circuit to, during the first time interval, form an estimated value of the first output signal of the amplifier, and during a first portion of the second time interval force the first output to substantially the estimated value.

An embodiment of the method may include that the second time interval may be subsequent to the first time interval.

The method may have an embodiment that includes configuring the first pre-drive circuit to force the first output to substantially the estimated value for only the first portion of the second time interval.

An embodiment may include configuring the first pre-drive circuit to couple a plurality of capacitors, such as for example capacitors 80-82 or 92-94, between a first voltage input and a second voltage input during the first time interval and selectively coupling one or more of the plurality of capacitors to the first output of the amplifier during the first portion of the second time interval.

An embodiment may include connecting a first terminal of the plurality of capacitors to the first voltage input and selectively connecting a second terminal of the one or more of the plurality of capacitors to the first output.

Another embodiment may include selectively coupling a number of capacitors that will force the first output to the estimated value within the first portion of the second time interval.

In an embodiment, the method may include forming the amplifier as a differential amplifier having the first output and having a second output that forms a second output signal that has a sign that is substantially opposite to a sign of the first output signal;

configuring the first pre-drive circuit to, responsively to the first time interval, selectively discharge a first plurality of capacitors, such as for example capacitors 112-138, and to selectively charge a second plurality of capacitors, such as for example capacitors 115-141, with current sources, such as for example sources 118-145; and configuring the first pre-drive circuit to selectively couple one or more of the first plurality of capacitors to one of the first output or the second output and to selectively couple one or more of the second plurality of capacitors to another one of the first output or the second output.

Another embodiment may include coupling a first terminal of the first plurality of capacitors to a first voltage input, such as for example input 85;

coupling a second terminal of a first capacitor, such as for example capacitor 112, of the first plurality of capacitors to a first terminal of a first switch, such as for example switch 114, and a first terminal of a second switch, such as for example switch 150;

coupling a second terminal of the first switch to the first output, such as for example output 18, and coupling a second terminal of the second switch to the second output, such as for example output 19;

coupling a first terminal of the second plurality of capacitors to a second voltage input, such as for example input 99;

coupling a second terminal of a second capacitor, such as for example capacitor 115, of the second plurality of capacitors to a first terminal of a third switch, such as for example switch 117, and a first terminal of a fourth switch, such as for example switch 151;

coupling a second terminal of the third switch to the first output and coupling a second terminal of the fourth switch to the second output; and configuring the first pre-drive circuit to selectively enable only one of the first switch or the second switch and only one of the third switch or the fourth switch during the first portion of the second time interval.

An embodiment may include connecting a fifth switch, such as for example switch 113, in parallel with the first capacitor, such as for example capacitor 112; and connecting a first terminal of a sixth switch, such as for example switch 116, to the second terminal of the second capacitor and connecting a second terminal of the sixth switch to receive current from a first current source, such as for example source 118, of the current sources.

Another embodiment may include forming the amplifier to have a second output;

configuring the first pre-drive circuit to include a first plurality of capacitors and a second plurality of capacitors; and configuring the first pre-drive circuit to selectively couple one of the first plurality of capacitors to the first output but not couple one of the second plurality of capacitors to the first output.

Those skilled in the art will appreciate that an example of an embodiment of an amplifier circuit may comprise:

a first output configured to form a first output signal having a first value;

a first pre-drive circuit configured to form a first estimated value of the first output signal and force the first output to substantially the first estimated value prior to the amplifier forming the first value on the first output.

The amplifier circuit may have an embodiment that may include a digital-to-analog converter circuit configured to form the first estimated value and force the first output to the first estimated value.

Another embodiment may include a first plurality of capacitors and a second plurality of capacitors, the first pre-drive circuit configured to selectively couple one of the first plurality of capacitors to the first output but not couple one of the second plurality of capacitors to the first output.

In an embodiment, the amplifier circuit may include a second output and a second pre-drive circuit; and the second pre-drive circuit including a third plurality of capacitors and a fourth plurality of capacitors, the second pre-drive circuit configured to selectively couple one of the third plurality of capacitors to the second output but not couple one of the fourth plurality of capacitors to the second output.

Another embodiment may include a second output; and the first pre-drive circuit including a first plurality of capacitors and a second plurality of capacitors, the first pre-drive circuit configured to selectively couple one or more of the first plurality of capacitors to one of the first output or the second output and to selectively couple one or more of the second plurality of capacitors to the other one of the first output or the second output.

Another embodiment may be configured to form the estimated value of the first output signal during a first time interval; and during a second time interval force the first output to substantially the first estimated value and to form the first output signal on the first output.

In view of all of the above, it is evident that a novel device and method is disclosed. Included, among other features, is forming a circuit to pre-drive the output of an amplifier with a signal having an estimated value of the output signal prior to the amplifier driving the output to the estimated value or to full value of the actual output signal.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of circuits 10, 73, 110, and 149 are used as a vehicle to explain the circuit and operation method of forming the estimated value of the actual value of the output signal and forcing the amplifier output to the estimated value, and that other embodiments by be realized.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A circuit for an analog-to-digital converter comprising:
   a first circuit configured to receive an input signal having an amplitude and form a first signal that is representative of the input signal, the first circuit configured to form the first signal during a first time interval;
   an amplifier configured to amplify signals having an amplitude that is within a first range of values;
   an adjustment circuit configured to adjust an amplitude of the first signal to be within the first range of values thereby forming an adjusted signal that is representative of the input signal;
   the amplifier configured to receive the adjusted signal during a second time interval and form an output signal on an output of the amplifier during the second time interval; and
   a pre-drive circuit configured to, during the first time interval, form an estimated value of the output signal and form a pre-drive signal having a value that is substantially the estimated value of the output signal and charge a capacitor with the pre-drive signal, the pre-drive circuit configured to couple the capacitor to the output of the amplifier during a portion of the second time interval but not during the first time interval.

2. The circuit of claim 1 wherein the amplifier is configured as a gain stage during the second time interval but not during the first time interval.

3. The circuit of claim 1 wherein the pre-drive circuit is configured to form the estimated value as one of a plurality of discrete values.

4. The circuit of claim 1 wherein the pre-drive circuit includes a digital-to-analog conversion circuit configured to form the pre-drive signal.

5. A method of forming an amplifier comprising:
   configuring the amplifier to receive an input signal;
   forming the amplifier to amplify a signal that is within an input range of values, the amplifier having a first output;
   configuring an adjustment circuit to adjust an amplitude of the input signal and to form a first signal during a first time interval wherein the first signal has an amplitude that is within the input range and is representative of the input signal;
   forming the amplifier to receive the first signal and to responsively form a first output signal on the first output during a second time interval but not during the first time interval; and
   configuring a first pre-drive circuit to, during the first time interval, form an estimated value of the first output signal of the amplifier, and during a first portion of the second time interval force the first output to substantially the estimated value.

6. The method of claim 5 wherein the second time interval is subsequent to the first time interval.

7. The method of claim 5 wherein configuring the first pre-drive circuit includes configuring the first pre-drive circuit to force the first output to substantially the estimated value for only the first portion of the second time interval.

8. The method of claim 5 wherein configuring the first pre-drive circuit includes configuring the first pre-drive circuit to couple a plurality of capacitors between a first voltage input and a second voltage input during the first time interval and selectively coupling one or more of the plurality of capacitors to the first output of the amplifier during the first portion of the second time interval.

9. The method of claim 8 wherein selectively coupling one or more of the plurality of capacitors includes connecting a first terminal of the plurality of capacitors to the first voltage input and selectively connecting a second terminal of the one or more of the plurality of capacitors to the first output.

10. The method of claim 8 wherein selectively coupling one or more of the plurality of capacitors includes selectively coupling a number of capacitors that will force the first output to the estimated value within the first portion of the second time interval.

11. The method of claim 5 wherein forming the amplifier includes forming the amplifier as a differential amplifier having the first output and having a second output that forms a second output signal that has a sign that is substantially opposite to a sign of the first output signal;
   configuring the first pre-drive circuit to, responsively to the first time interval, selectively discharge a first plurality of capacitors and to selectively charge a second plurality of capacitors with current sources; and
   configuring the first pre-drive circuit to selectively couple one or more of the first plurality of capacitors to one of the first output or the second output and to selectively couple one or more of the second plurality of capacitors to another one of the first output or the second output.

12. The method of claim 11 further including coupling a first terminal of the first plurality of capacitors to a first voltage input;
   coupling a second terminal of a first capacitor of the first plurality of capacitors to a first terminal of a first switch and a first terminal of a second switch;
   coupling a second terminal of the first switch to the first output and coupling a second terminal of the second switch to the second output;
   coupling a first terminal of the second plurality of capacitors to a second voltage input;
   coupling a second terminal of a second capacitor of the second plurality of capacitors to a first terminal of a third switch and a first terminal of a fourth switch;
   coupling a second terminal of the third switch to the first output and coupling a second terminal of the fourth switch to the second output; and
   configuring the first pre-drive circuit to selectively enable only one of the first switch or the second switch and only one of the third switch or the fourth switch during the first portion of the second time interval.

13. The method of claim 12 further including connecting a fifth switch in parallel with the first capacitor; and
   connecting a first terminal of a sixth switch to the second terminal of the second capacitor and connecting a second terminal of the sixth switch to receive current from a first current source of the current sources.

14. The method of claim 5 further including forming the amplifier to have a second output;
   configuring the first pre-drive circuit to include a first plurality of capacitors and a second plurality of capacitors; and
   configuring the first pre-drive circuit to selectively couple one of the first plurality of capacitors to the first output but not couple one of the second plurality of capacitors to the first output.

15. An amplifier circuit comprising:
   an amplifier;
   a first output configured to form a first output signal having a first value; and
   a first pre-drive circuit configured to form a first estimated value of the first output signal during a first time interval and force the first output to substantially the first estimated value during a second time interval and prior to the amplifier forming the first value on the first output.

16. The amplifier circuit of claim 15 wherein the first pre-drive circuit includes a digital-to-analog converter circuit configured to form the first estimated value and force the first output to the first estimated value.

17. An amplifier circuit comprising:
a first output configured to form a first output signal having a first value;
a first pre-drive circuit configured to form a first estimated value of the first output signal and force the first output to substantially the first estimated value prior to an amplifier forming the first value on the first output wherein the first pre-drive circuit includes a first plurality of capacitors and a second plurality of capacitors, the first pre-drive circuit configured to selectively couple one of the first plurality of capacitors to the first output but not couple one of the second plurality of capacitors to the first output.

18. The amplifier circuit of claim 17 wherein the amplifier circuit includes a second output and a second pre-drive circuit; and
the second pre-drive circuit including a third plurality of capacitors and a fourth plurality of capacitors, the second pre-drive circuit configured to selectively couple one of the third plurality of capacitors to the second output but not couple one of the fourth plurality of capacitors to the second output.

19. An amplifier circuit comprising:
a first output configured to form a first output signal having a first value;
a first pre-drive circuit configured to form a first estimated value of the first output signal and force the first output to substantially the first estimated value prior to an amplifier forming the first value on the first output;
a second output; and
the first pre-drive circuit including a first plurality of capacitors and a second plurality of capacitors, the first pre-drive circuit configured to selectively couple one or more of the first plurality of capacitors to one of the first output or the second output and to selectively couple one or more of the second plurality of capacitors to the other one of the first output or the second output.

* * * * *